(12) United States Patent
Hahn et al.

(10) Patent No.: US 8,179,135 B2
(45) Date of Patent: May 15, 2012

(54) LOW FIELD ELECTRON PARAMAGNETIC RESONANCE IMAGING WITH SQUID DETECTION

(75) Inventors: Inseob Hahn, La Crescenta, CA (US); Peter K. Day, Pasadena, CA (US); Konstantin I. Penanen, Glendale, CA (US); Byeong H. Eom, Pasadena, CA (US); Mark S. Cohen, Calabasas, CA (US)

(73) Assignees: California Institute of Technology, Pasadena, CA (US); The Regents of the University of California, Oakland, CA (US)

( * ) Notice: Subject to any disclaimer, the term of this patent is extended or adjusted under 35 U.S.C. 154(b) by 443 days.

(21) Appl. No.: 12/359,576

(22) Filed: Jan. 26, 2009

(65) Prior Publication Data

US 2009/0295390 A1  Dec. 3, 2009

(30) Foreign Application Priority Data

Jan. 28, 2008  (WO) ................ PCT/US2008/001136

(51) Int. Cl.
*G01V 3/00* (2006.01)
(52) U.S. Cl. ....................... 324/307; 324/309
(58) Field of Classification Search .......... 324/300–322; 600/407–445; 343/772, 700, 872, 900
See application file for complete search history.

(56) References Cited

U.S. PATENT DOCUMENTS

| | | | | |
|---|---|---|---|---|
| 4,937,525 A * | 6/1990 | Daalmans | ..................... | 324/248 |
| 5,291,135 A * | 3/1994 | Hotta et al. | ..................... | 324/248 |
| 5,334,884 A * | 8/1994 | Tesche | ..................... | 327/113 |
| 5,656,937 A * | 8/1997 | Cantor | ..................... | 324/248 |
| 5,885,215 A | 3/1999 | Dossel et al. | | |
| 6,289,234 B1 * | 9/2001 | Mueller | ..................... | 600/410 |
| 7,087,008 B2 * | 8/2006 | Fox et al. | ..................... | 600/13 |
| 7,369,093 B2 * | 5/2008 | Oppenlander et al. | ........ | 343/772 |
| 7,482,804 B2 * | 1/2009 | Tilbrook et al. | ............. | 324/248 |
| 2010/0264921 A1 * | 10/2010 | Horng et al. | .................. | 324/309 |

OTHER PUBLICATIONS

PCT International Search Report for PCT/US2008/001136 filed on Jan. 28, 2008 in the name of Inseob Hahn, et al.
PCT Written Opinion for PCT/US2008/001136 filed on Jan. 28, 2008 in the name of Inseob Hahn, et al.
McDermott R., et al., SQUID-detected Magnetic Resonance Imaging in Microtesla Magnetic Fields, Journal of Low Temperature Physics, 2004, 135: 793-821.
Welty R. et al., Two-stage Integrated SQUID Amplifier with Series Array Output, IEE, 1993, 3: 2605-2608.
Chui T., et al., High-resolution Displacement Sensor Using SQUID Array Amplifier, Nuclear Physics, 2004, 134:214-216.
Brenner, D., et al., Application of a SQUID for Monitoring Magnetic Response of the Human Brain, IEEE Transactions on Magnetics, Jan. 1977, Mag-13: 365-368.
Hahn, I., et al., An X-band SQUID Multiplexer, Low Temperature Physics, 2006, 1613-1614.
Greenberg, Y. Application of Superconducting Quantum Interference Devices to Nuclear Magnetic Resonance, Rev. Mod. Phys., 1998 70, 175.
Chamberlin, R., et al., Application of Superconducting Quantum Interference Devices to Nuclear Magnetic Resonance, Journal of Low Temperature Physics, 1979, 35:337.

*Primary Examiner* — Brij Shrivastav
(74) *Attorney, Agent, or Firm* — Steinfl & Bruno LLP

(57) ABSTRACT

In one embodiment, a flux transformer with a gradiometer pickup coil is magnetically coupled to a SQUID, and a SQUID array amplifier comprising a plurality of SQUIDs, connected in series, is magnetically coupled to the output of the SQUID. Other embodiments are described and claimed.

5 Claims, 2 Drawing Sheets

LOW FIELD ELECTRON PARAMAGNETIC RESONANCE IMAGING WITH SQUID DETECTION

GOVERNMENT INTEREST

The invention claimed herein was made in the performance of work under a NASA contract, and is subject to the provisions of Public Law 96-517 (35 USC 202) in which the Contractor has elected to retain title.

PRIORITY CLAIM

This application claims the benefit of PCT application PCT/US2008/001136, filed 28 Jan. 2008.

FIELD

The present invention relates to electron paramagnetic resonance imaging.

BACKGROUND

Electron paramagnetic resonance (EPR) imaging has been recently recognized as an important tool for non-invasive imaging of free radicals and REDOX (reduction/oxidization) metabolism. In principle, electron paramagnetic resonance may be observed at frequencies of a few MHz in magnetic fields of a few Gauss, up to the microwave region in a magnetic field of a few thousand Gauss. Traditionally, the latter frequency region is often chosen because the signal-to-noise ratio is usually much improved with the use of relatively high magnetic fields, which implies a relatively high Lamour frequency. However, the use of microwave radiation (e.g., in the 1 GHz to 60 GHz region) is currently known to require a special resonance cavity that is not suitable for non-invasive imaging of a large size living animal, such as a human. For example, the motion of an animal in a resonance cavity, such as motion due to respiration or a beating heart, may cause changes in the resonance frequency of the cavity. In addition, generally the skin depth decreases as the frequency of the electromagnetic radiation increases, which may preclude imaging within regions of interest in a human for EPR imaging systems operating in the 1 GHz to 60 GHz region. Furthermore, high magnetic fields often pose a safety hazard.

The high frequency microwave radiation of prior art EPR imaging systems appears to pose a physical and biological hindrance to the advance of EPR imaging technology for large size living animals. Recently, there has been work in developing an EPR imaging system that employs low magnetic fields (e.g., on the order of 10 mT) at radio frequencies (e.g., about 300 MHz) where the RF (radio frequency) energy may penetrate into biological objects. However, EPR techniques developed for clinical applications to date still rely on conventional RF detection schemes which are believed to degrade signal-to-noise ratio at low magnetic fields.

DESCRIPTION OF EMBODIMENTS

In the description that follows, the scope of the term "some embodiments" is not to be so limited as to mean more than one embodiment, but rather, the scope may include one embodiment, more than one embodiment, or perhaps all embodiments.

Figure 1:
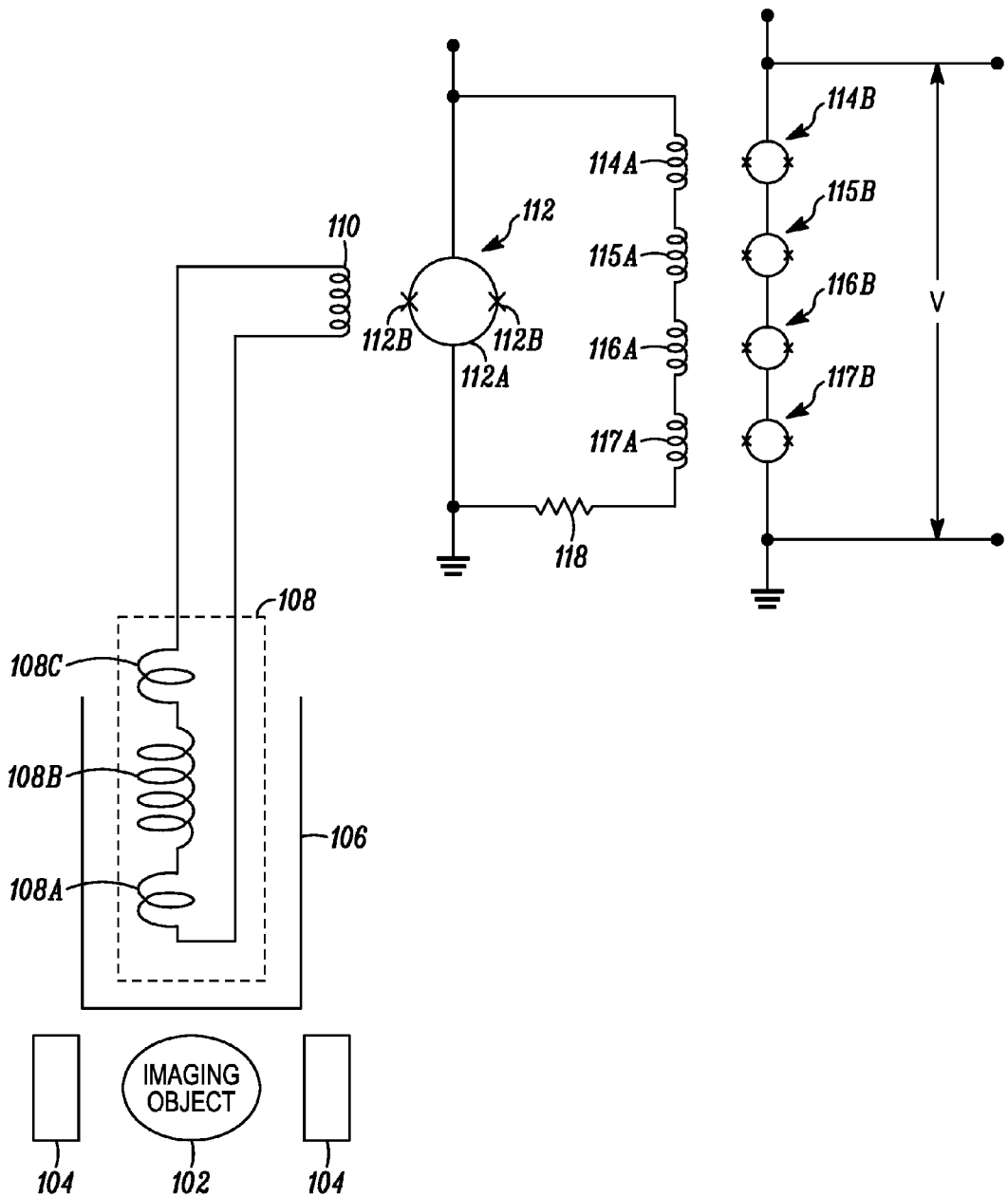
FIG. 1 illustrates an EPR SQUID detection system according to an embodiment.

FIG. 1 is a schematic illustrating EPR detection with a SQUID (Superconducting Quantum Interference Device) according to an embodiment. Object 102 is the specimen (e.g., human) to be imaged. Coil system 104 comprises various coils to apply to object 102 a magnetic field having a spatial gradient, and to provide pulses of electromagnetic excitation to object 102 so that electron spin echo pulses may be detected. As is well known, the Lamour frequency of an electron spin echo pulse depends on magnetic field strength, so that spectral analysis applied to the received electron spin echo pulses yields imaging information. For ease of illustration, the various components making up coil system 104 are not shown in FIG. 1, but are described later with respect to FIG. 2.

The remaining components in the detector of FIG. 1 are kept at a low temperature during operation so that they operate in their superconducting state. For some embodiments, the temperature is about 4.2 Kelvin, although for some embodiments, high-temperature superconductors may be used. The superconducting temperature is maintained by operating these components in a Dewar or cryostat, with electrical connections available for room temperature components. For ease of illustration, only a portion of a Dewar, labeled as 106, is shown in FIG. 1.

The EPR imaging embodiment of FIG. 1 comprises a second order gradiometer within dashed rectangle 108 to receive the electron spin echo pulses from object 102. In the particular embodiment of FIG. 1, the gradiometer comprises two turns (108A), four turns (108B), and two turns (108C) of 80 µm diameter Nb (Niobium) wire wound on a MACOR® former grooved for the wire. MACOR is a registered trademark of Corning Glass Works Corporation, Houghton Park, Corning, N.Y. For the particular embodiment of FIG. 1, the gradiometer baseline is 55 mm and the loop diameter is 25.4 mm. The inductance of the gradiometer is 1.02 µH. The total effective sensing area of the gradiometer is about 6.5 mm². The average distance from the gradiometer to object 102 is about 15 mm. By using a gradiometer, the EPR imaging system of FIG. 1 is not sensitive to homogeneous magnetic fields, such as unwanted magnetic fields from far away sources that are essentially homogenous over the scale of the gradiometer. Other embodiments other than that described with reference to FIG. 1 may utilize other types of pickup coils sensitive to electron spin echo pulses.

Coil 110 is electrically connected to the gradiometer and is magnetically coupled to SQUID 112. SQUID 112 comprises SQUID loop 112A and Joshepson junctions 112B, and for the embodiment of FIG. 1 is a DC (Direct Current) SQUID. Magnetic flux from coil 110 links SQUID loop 112A. The combination of coil 110 and the gradiometer serves as a flux transformer. In practice, the physical dimension of SQUID 112 is on the order of microns, whereas the gradiometer is on the order of centimeters.

Using a flux transformer is a practical way of providing SQUID detection of magnetic flux due to the electron spin echo pulses generated by the unpaired electrons within object 102. Furthermore, by using SQUID 112 with the flux transformer, the operation frequency may be significantly lowered when compared to prior art systems. For example, for some embodiments, the operating frequency may be 1.4 MHz at the Earth's magnetic field of 0.5 Gauss. At this relatively low frequency, the electron spin echo pulses may be detected by use of a gradiometer without the need for a cavity resonator. Furthermore, the skin depth of muscle tissues at 2 MHz is approximately 30 cm. The Specific Absorption Rate (SAR) is essentially negligible for an operating frequency in the 1 MHz range.

The embodiment of FIG. 1 also makes use of a SQUID array amplifier, comprising a plurality of coils coupled to the output of SQUID 112, and a plurality of SQUIDs magnetically coupled to the coils. For simplicity, only four SQUIDs in an array amplifier are shown in FIG. 1, but in practice, there may be on the order of one hundred SQUIDs in a SQUID array amplifier. In the simplified SQUID array amplifier of FIG. 1, coils 114A, 115A, 116A, and 117A are connected in series with each other, and connected to the output of SQUID 112 by way of resistor 118. SQUIDs 114B, 115B, 116B, and 117B are connected in series with each other, where SQUID 114B is magnetically coupled to coil 114A, SQUID 115B is magnetically coupled to coil 115A, SQUID 116B is magnetically coupled to coil 116A, and SQUID 117B is magnetically coupled to coil 117A.

The output of the SQUID array amplifier is taken across series-connected SQUIDs 114B, 115B, 116B, and 117B. For some embodiments, the SQUID array amplifier is expected to have a bandwidth of about 1 MHz using commercially available SQUIDs.

Well-known components used in the art of SQUID detectors are not shown in FIG. 1 for simplicity. For example, typically, SQUID readout electronics employ feedback to keep the flux in the SQUID loop at a sensitive part of its response (modulation) function and to linearize the response.

Figure 2:
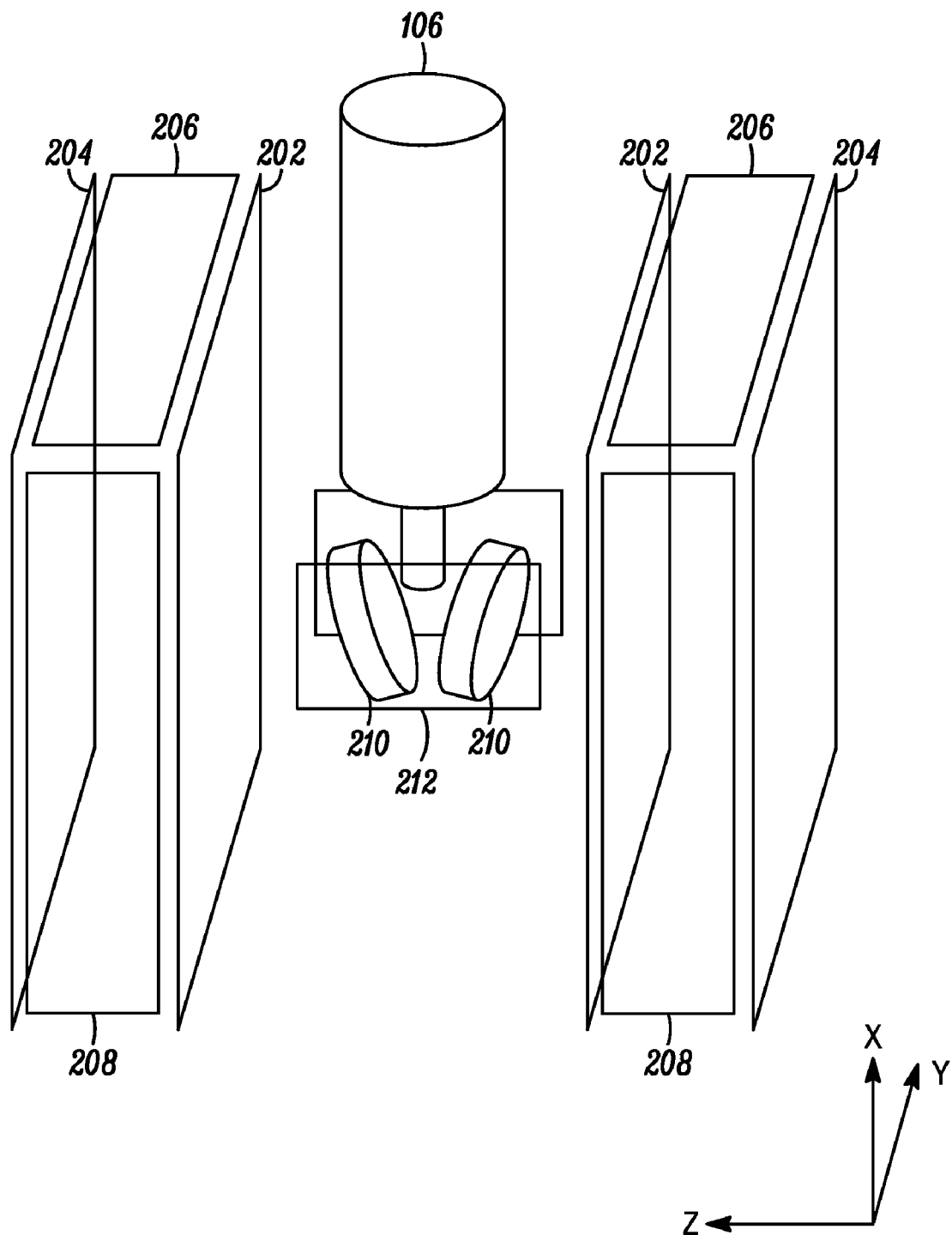
FIG. 2 illustrates a coil system according to the embodiment of FIG. 1.

FIG. 2 is a schematic illustration of a coil system for generating magnetic fields so that unpaired electrons in object 102 give off electron spin echo pulses. FIG. 2 illustrates a coil system comprising square Helmholtz coil 202 to provide a homogenous static magnetic field, square Maxwell coil 204 to provide a z-gradient in the applied magnetic field, x-gradient coil 206 to provide an x-gradient in the applied magnetic field, and y-gradient coil 208 to provide a y-gradient in the applied magnetic field. The x-y-z directions are indicated by the coordinate system displayed in FIG. 2.

FIG. 2 further illustrates pre-polarizing coil 210 to increase the magnetization of object 102, and excitation coil 212 to provide an oscillating magnetic field perpendicular to the homogenous static magnetic field. The excitation pulses generated by excitation coil 212 provide the $\pi/2$ and $\pi$ magnetic pulses that are often described semi-classically as tipping the magnetization vectors in object 102 so that electron spin echo pulses are generated.

FIG. 2 also illustrates a portion of a Dewar (106) to contain the flux transformer and the SQUID detector components illustrated in FIG. 1. FIG. 2, like FIG. 1, is a schematic, so that relative sizes are not implied. Furthermore, the coils illustrated in FIG. 2 are simplified, so that electrical connections and individual turns are not shown, but rather, the coils are schematically illustrated as simple rectangles, or simple cylinders (to represent solenoids, to be discussed later) in the case of pre-polarization coil 210.

The measurement sequence includes a pre-polarization interval, followed by encoding and acquisition. Pre-polarization coil 210 polarizes object 102 in a higher magnetic field than the homogeneous static magnetic field provided by Helmholtz coil 202, and this pre-polarization technique uses a fast ramping-down of the pre-polarizing field. For the embodiment of FIG. 2, pre-polarizing coil 210 comprises two identical short and thick solenoids, and has a symmetric design so that it does not induce an appreciable magnetic flux to the gradiometer. In this way, a current-limiting device is not necessarily needed in the gradiometer to protect SQUID 112 from an excessive current that may be induced by a fast change (about 10 T/s) of the pre-polarizing field. It was found that any remaining residual asymmetry in the coil design and position of pre-polarization coil 210 may be sufficiently corrected by moving Dewar 106 with respect to pre-polarization coil 210 while observing the SQUID voltage response to a low-frequency AC (Alternating Current) magnetic field induced in pre-polarization coil 210. For some embodiments, the polarization provided by pre-polarization coil 210 may not be required for the EPR detection if the signal strength is large enough.

The shape and the separation of the two solenoids for pre-polarization coil 210 may be chosen for easy construction, convenient imaging volume access, and based upon the tentative sample size of object 102. The thickness and the diameter of the wire for pre-polarization coil 210 were determined to maximize the field strength at the center at fixed power. Once the shape and the size are determined, the ratio of the field strength to the applied power is independent of the wire diameter and the number of windings. The coil former was built out of fiberglass to prevent eddy current effects and induced magnetization. For this same reason, most of the experimental setup for an embodiment was built out of various fiberglass materials with adequate magnetic characteristics for each component.

For some embodiments, it was found that if the two solenoids forming pre-polarization coil 210 were aligned coaxially, then the close proximity of the massive copper coils to the gradiometer induced significant thermal noise. To reduce the noise and to increase the magnetic field with the distance from the gradiometer, the solenoids were aligned in a V shape so that the separation is larger at the top end near the gradiometer. This arrangement was found to partially compensate the sensitivity profile of the gradiometer.

For an experimental embodiment, the parameters for the coil system of FIG. 2 may be described as follows. For pre-polarization coil 210, two solenoids were used, each with an outer diameter of 204 mm, an inner diameter of 38 mm, a thickness of 35 mm, with a top separation of 149 mm and a bottom separation of 19 mm. The windings comprised 398 turns in 6 parallel groups, to provide a magnetic field of 2.4 mT/A. Helmholtz coil 202 is a square shaped coil with a 1108 mm side and a separation of 603 mm. The windings comprised 30 turns to provide 44 µT/A. Maxwell coil 204 is a square shaped coil with a 1108 mm side, with windings comprising 15 turns in two parallel groups, to provide a magnetic field gradient of 32 $\mu Tm^{-1}A^{-1}$. X-gradient coil 206 and y-gradient coil 208 are each a bi-planar coil, each with a long side of 1087 mm, a short side of 188 mm, having a plane separation of 1108 mm and an in-plane separation of 647 mm. Each has windings comprising 15 turns in two parallel groups, to provide a magnetic field gradient of 12 $\mu Tm^{-1}A^{-1}$. Excitation coil 212 comprised a pair of rectangular coils, each with a long side of 400 mm, a short side of 319 mm, with a separation of 183 mm, with each winding comprising 2 turns to provide a magnetic field of 9.5 µT/A.

Various modifications may be made to the disclosed embodiments without departing from the scope of the invention as defined below.

What is claimed is:

1. An apparatus comprising:
   a SQUID;
   a flux transformer magnetically coupled to the SQUID, the flux transformer comprising a gradiometer pickup coil; and
   a SQUID array amplifier comprising a plurality of SQUIDs connected in series to each other and magnetically coupled to the SQUID;

wherein the gradiometer pickup coil further comprises:
a first coil having a first number of turns;
a second coil having a second number of turns equal to twice the first number of turns and wound in an opposite direction to the first coil; and
a third coil having the first number of turns and wound in the same direction as the first coil.

2. The apparatus as set forth in claim 1, further comprising: a Helmholtz coil to provide a homogeneous static magnetic field; and a pre-polarization coil to provide a higher magnetic field than the homogeneous static magnetic field provided by the Helmholtz coil.

3. The apparatus as set forth in claim 2, the pre-polarizing coil comprising two substantially identical solenoids so as to not induce an appreciable magnetic flux to the gradiometer pickup coil.

4. The apparatus as set forth in claim 3, where the solenoids are aligned in a V shape so as to have a separation larger at a top end near the gradiometer pickup coil.

5. The apparatus as set forth in claim 1, wherein the plurality of SQUIDs are magnetically coupled to the SQUID through a plurality of coils.

\* \* \* \* \*